United States Patent [19]

Sloane

[11] 4,354,177

[45] Oct. 12, 1982

[54] METHOD AND APPARATUS FOR CALIBRATING AN ANALOG-TO-DIGITAL CONVERTER FOR A DIGITAL-TO-ANALOG CONVERTER TEST SYSTEM

[75] Inventor: Edwin A. Sloane, Los Altos, Calif.

[73] Assignee: Fairchild Camera & Instr. Corp., Mountain View, Calif.

[21] Appl. No.: 288,965

[22] Filed: Jul. 31, 1981

Related U.S. Application Data

[63] Continuation-in-part of Ser. No. 264,928, May 18, 1981, which is a continuation-in-part of Ser. No. 204,979, Nov. 7, 1980.

[51] Int. Cl.³ .......................................... H03K 13/02
[52] U.S. Cl. ...................... 340/347 CC; 340/347 AD; 364/553; 371/25
[58] Field of Search ............. 371/25, 26; 340/347 CC, 340/347 AD; 364/571, 580, 553; 324/130

[56] References Cited

U.S. PATENT DOCUMENTS 3,154,738 10/1964 Greene ........................ 340/347 CC

OTHER PUBLICATIONS

Sellier "IBM Technical Disclosure Bulletin" vol. 22, No. 3, Aug. 1979, pp. 1039-1040.
Corcoran "IEEE Transactions on Instrumentation and Measurement" vol. IM-24 No. 4, Dec. 1975, pp. 370-374.
Pau "Fast Testing & Trimming of A/D and D/A converters in Automatic Test Systems" Paper Presented at 1978, IEEE Autotest.

Primary Examiner—C. D. Miller
Attorney, Agent, or Firm—Kenneth Olsen; Theodore S. Park; Michael J. Pollock

[57] ABSTRACT

A method and apparatus for exciting the analog input of an analog-to-digital converter and examining the output by means of analysis with histograms to determine the amplitude probability distribution of each digital output value. The amplitude probability density functions corresponding to accurately known excitation signals may then be processed to obtain a description of the transfer characteristic for the analog-to-digital converter to be calibrated. In a particular embodiment, the excitation signals applied to the analog input of the analog-to-digital converter are pairs of signals representing accurately known rising and decaying exponential signals, and particularly exponential signals which are complementary to one another. Histograms of the digital response to the analog excitation signals are then constructed which correspond to amplitude density functions. The histograms may be processed in a manner which produces the transfer characteristic of the converter under test which is independent of the dynamic characteristics of the excitation signals, thus eliminating the need for accurate knowledge of the parameter values of the testing circuit.

12 Claims, 4 Drawing Figures

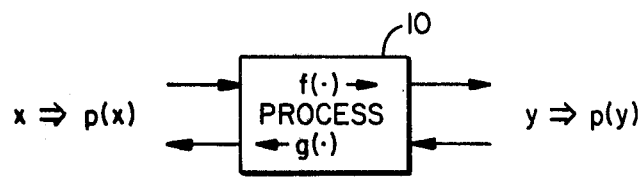
FIG._1.
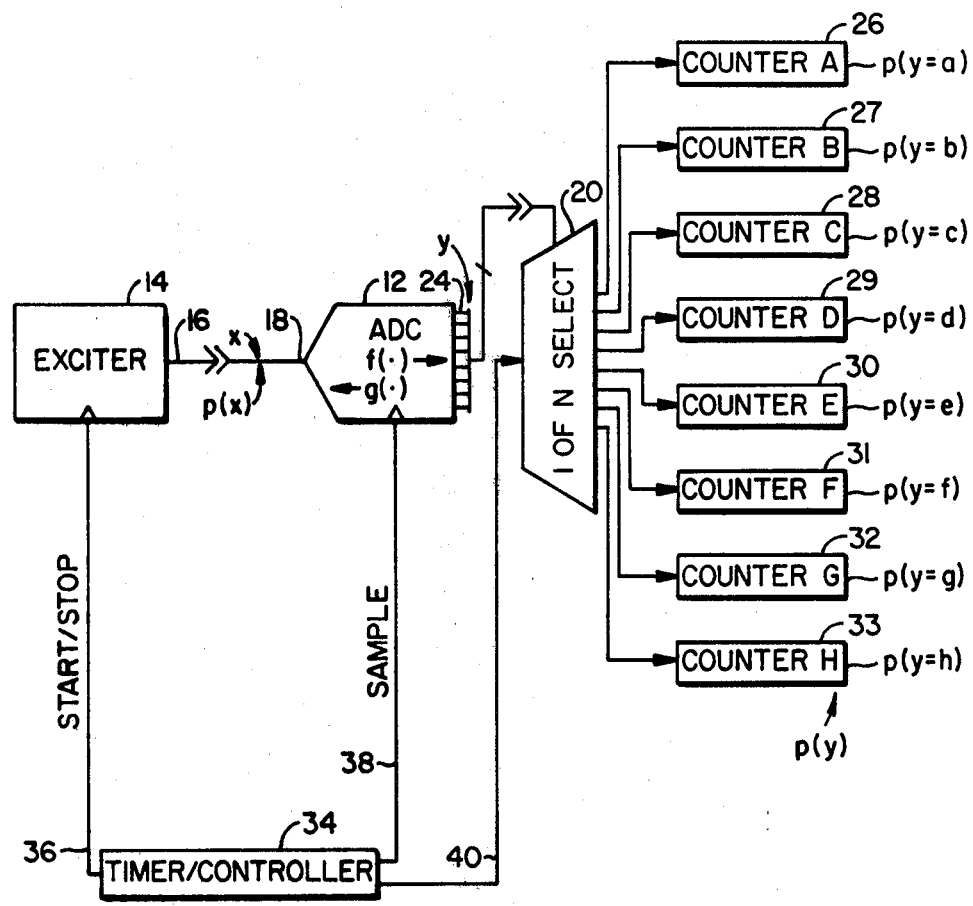
FIG._2.

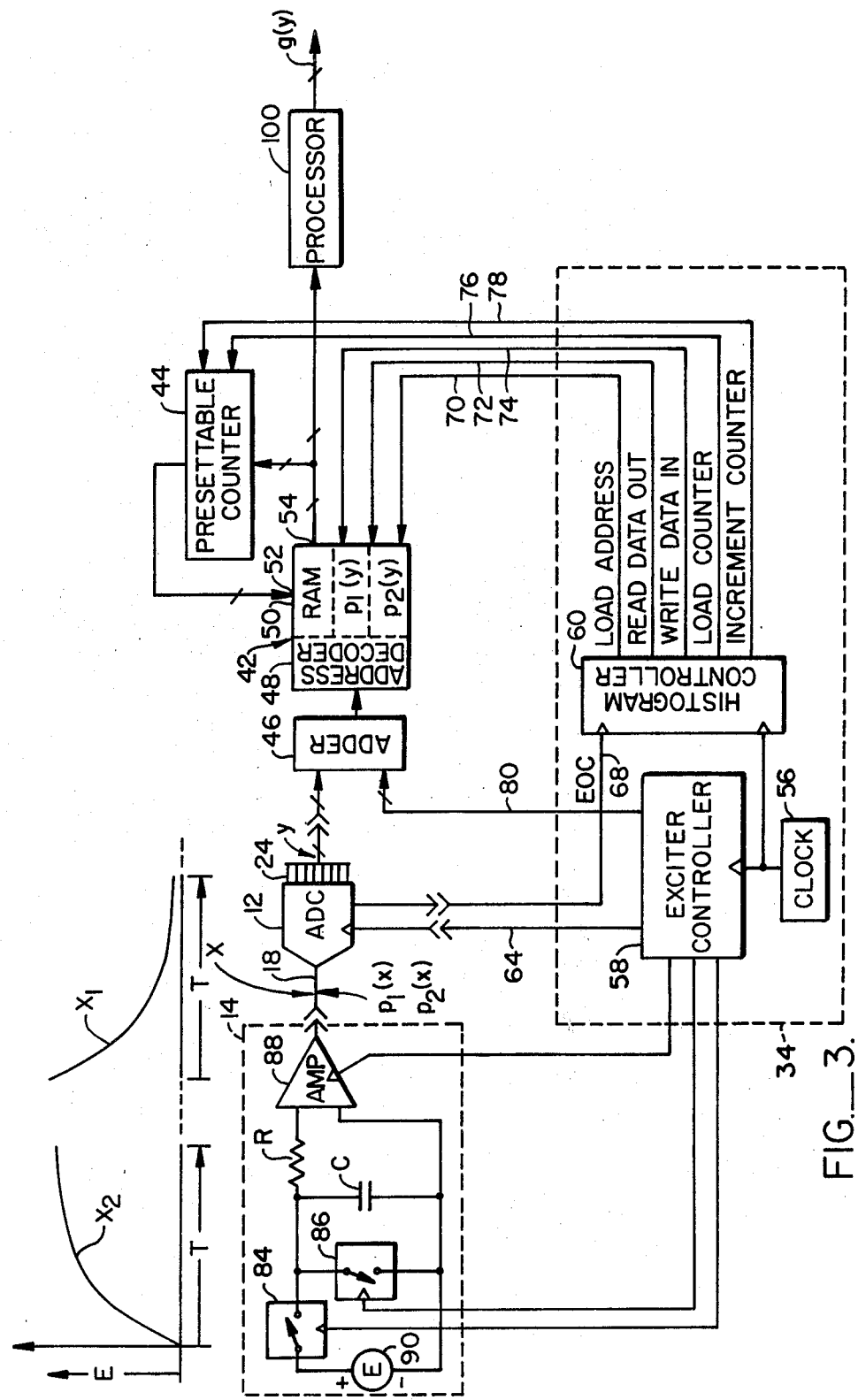
FIG._3.

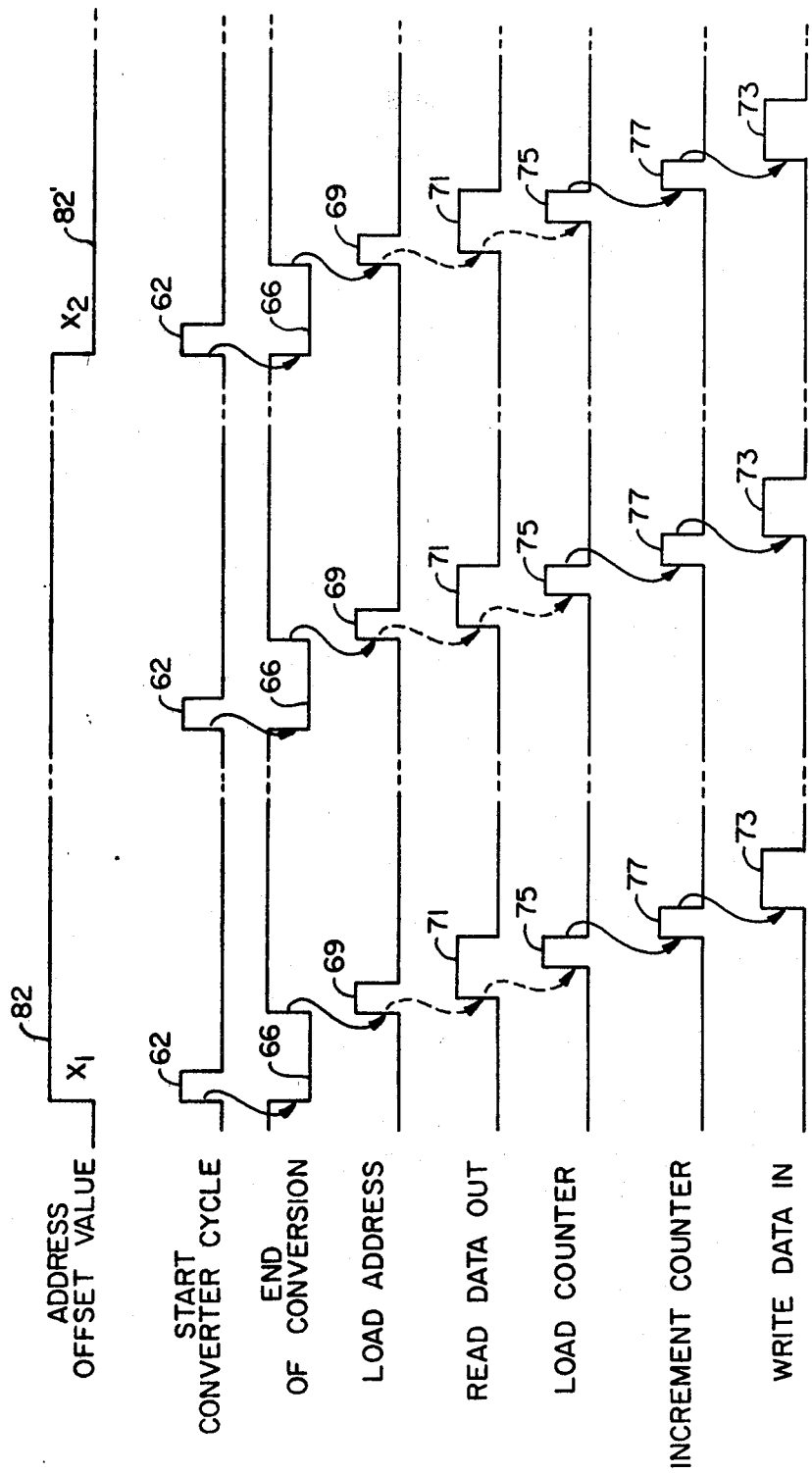

METHOD AND APPARATUS FOR CALIBRATING AN ANALOG-TO-DIGITAL CONVERTER FOR A DIGITAL-TO-ANALOG CONVERTER TEST SYSTEM

This application is a continuation-in-part application of copending application Ser. No. 264,928 entitled METHOD FOR ANALYZING A DIGITAL-TO-ANALOG CONVERTER WITH A NONIDEAL ANALOG-TO-DIGITAL CONVERTER, filed May 18, 1981, which application is a continuation-in-part application of copending application Ser. No. 204,979, filed Nov. 7, 1980.

BACKGROUND OF THE INVENTION

This application relates to automatic test systems for digital electronic converters and statistical methods for testing analog-to-digital converter and digital-to-analog converters. More particularly, this invention relates to a method for calibrating an analog-to-digital converter employing statistical amplitude density functions. In addition, the techniques described herein may be used in analysis of analog-to-digital and digital-to-analog converters.

Converters between the digital and analog signal domains are employed to interface digital electronic circuitry and analog devices. Accuracy of conversion, gain and repeatability in the process of conversion are matters of concern. One method of testing a digital-to-analog converter is to apply a digital signal to its input and obtain an analog output signal, then to apply the analog signal to the input of an analog-to-digital converter to recover a digital signal and then to process the output signal to determine its statistical characteristics. The characteristics of the output signal in terms of a statistical description provide an indication of the accuracy of the digital-to-analog converter.

Such an analysis presupposes the use of a calibrated or "characterized" analog-to-digtal converter. By "characterized" it is meant that the transfer characteristic either from the input to the output or from the output to the input is known to an accuracy commensurate with the accuracy of the device to be analyzed. The transfer characteristic may be described in terms of premeasured weighting coefficients of a polynomial of the powers of two or in any other form which accurately reflects the process of converting a signal x into a signal y, or alternatively, a signal y into a signal x. For example, such a characterization may be formulated in terms of two-state orthogonal functions such as the Walsh functions.

Description of the Prior Art

State of the art calibration and testing techniques for analog-to-digital converters are generally limited to examining the digital output value signal in response to a known, fixed analog input signal. Generally all tests are static in nature and are incapable of providing a complete statistical evaluation of a converter based on exercise of substantially all possible states.

Recently, dynamic testing techniques have been suggested for limited purposes. An example is a method proposed by L. F. Pau and presented in a paper entitled "Fast Testing and Trimming of A/D and D/A Converters in Automatic Test Systems" at the 1978 IEEE Autotest Conference. Pau suggested analyzing an error signal obtained by comparing the output of the device under test to a reference presumed to be ideal by means of Walsh functions. Other known evaluation methods also presuppose the use of an ideal reference device, such as an analog-to-digital converter having a linear transfer characteristic, the output response of which is employed with the output response of a device under test to generate the desired error signal. A device built according to the prior art techniques, for example, the technique taught by Pau, is therefore limited by the linearity and accuracy of the reference device.

One of the concerns of prior art converter testing methods has been an inability to distinguish between signal-induced biases or errors and biases or errors inherent in the testing devices. Accordingly, much effort has been devoted to linearization of the excitation signals and of the transfer characteristics of the measuring devices, such as the analog-to-digital converter used to detect the output of the digital-to-analog converter under test. The present invention represents a departure from this effort to idealize and linearize the testing equipment.

Cross-Reference to Related Applications

In the copending parent patent application entitled METHOD FOR ANALYZING A DIGITAL-TO-ANALOG CONVERTER WITH A NONIDEAL ANALOG-TO-DIGITAL CONVERTER, a method is described for analyzing a digital-to-analog converter by exciting the digital inputs from a digital exciter which generates at each bit input a known two-state signal which is orthogonal with respect to all other excitation signals, the sum of the excitation signals representing a single signal with uniform amplitude distribution. The method described therein is particularly adapted to analysis by Walsh functions.

In the copending parent application to the present parent application entitled METHOD AND APPARATUS FOR DIGITAL CONVERTER TESTING, a method and apparatus are disclosed for dynamically testing the overall performance characteristics of both digital-to-analog converters and analog-to-digital converters. The method comprises dynamically exercising an analog or digital converter with, respectively, analog or digital signal patterns which can be characterized as the sum of a set of mutually orthogonal two-state functions of defined amplitudes, the sum having substantially uniform amplitude distribution over the allowable states. The technique involves examining the response of the converter under test for a number of basic performance parameters, including total distortion, linearity and optimum gain. The method therein described yields a relatively complete statistical description of the performance characteristics of the device under test.

The disclosure of the two-above-mentioned patent applications are incorporated herein by reference and made a part hereof. The present application describes one possible calibration method for an analog-to-digital converter which might be used in a test system described in the related applications.

SUMMARY OF THE INVENTION

In accordance with the present invention, a method and apparatus is described for exciting the analog input of an analog-to-digital converter and examining the output by means of histograms to estimate the amplitude probability distribution of each digital output value. The amplitude probability density functions corresponding to accurately known excitation signals may then be processed to obtain a description of the transfer characteristic for the analog-to-digital converter to be calibrated. In a particular embodiment, the excitation signals applied to the analog input of the analog-to-digital converter are pairs of signals representing accurately known rising and decaying exponential signals, and particularly exponential signals which are complementary to one another. Histograms of the digital response to the analog excitation signals are then constructed. The histograms may be processed in a manner which produces the transfer characteristic of the converter under test which is independent of many parameters of the excitation signals, thus eliminating the need for accurate knowledge of the values of circuit components in the excitation generator. In fact, a digital-to-analog converter can be accurately calibrated with only three factors, namely, the voltage range of the excitation signals, and the probability density functions (histograms) for each of the two exponential excitation signals.

Another advantage of the use of exponential signals for exciting the converter is the ease of precision generation. A particular advantage of this method of analysis is its ease of use in relating the histogram obtained by a nonlinear excitation signal, particularly an exponential signal, to a calibration and moreover may be extended to applications involving testing of converters through use of any repeatable nonlinear excitation signal.

In a specific embodiment of an apparatus according to the method of the invention, a histogram device is provided which comprises random access memory (RAM), a counter and appropriate timing controllers, the random access memory being adapted to decode digital values produced at the output of an analog-to-digital converter as addresses of histogram cells, and the counter being operative to accumulate the number of occurrences of each such histogram value for storage in the RAM. The timing controllers provide the needed synchronization with the excitation signals and converter operation.

The invention will be better understood by reference to the following detailed description of specific embodiments taken in connection with the accompanying drawings.

BRIEF DESCRIPTION OF THE DRAWINGS

FIG. 1 is a block diagram for illustrating the transfer characteristic of a generalized process.

FIG. 2 is a block diagram illustrating one specific embodiment of an apparatus according to the invention.

FIG. 3 is a block diagram illustrating another specific embodiment.

FIG. 4 is a timing diagram for controllers of the type employed in the embodiment of FIG. 3.

DETAILED DESCRIPTION OF SPECIFIC EMBODIMENTS

The invention involves a statistical method employing amplitude probability density functions which are obtained from the analog to digital conversion of repeatable accurately known functions, particularly natural exponential functions. In general, a uniformly distributed signal such as a linear ramp signal could be used in accordance with the invention. However, the problems of generating repeatable precision linear analog ramp signals are severe.

Referring to FIG. 1, by way of background, it is the object of this invention to characterize a certain transformation process, for example, represented by a general device 10. The device 10 has a transfer characteristic of x to y of f(x) and a transfer characteristic of y to x of g(y). For each function x there is associated therewith an amplitude probability density function p(x). Similarly, for each function y, there is associated therewith an amplitude probability density function p(y). The amplitude probability density function is simply the distribution of a likelihood of occurrences of the values over the range of possible values. Closely associated with the probability density function is the amplitude histogram. A histogram is a graphic representation of a frequency distribution in which the range of the histogram cells is proportional to the sample range and the accumulated number of recorded events in each cell is proportional to the frequency of occurrence of events within the cell range. Accordingly, histogram data are directly proportional to the amplitude probability density function for a continuous random variable (provided that the histogram interval is small relative to the rate of change over the interval of observation) as well as for a discrete random variable whose sample range is chosen to correspond to the range of the histogram cell.

For the functions:

$$y = f(x) \tag{1}$$

and $$x = g(y) \tag{2}$$

it can be shown from elementary probability theory that the product of the probability of x and an incremental change in x is equal to the product of probability of y and an incremental change in y, or $$p(x)dx = p(y)dy \tag{3}$$

where
  p(x) is the probability density function of x; and
  p(y) is the probability density function of y.

It follows immediately that the first derivative of the function f(x) is equal to the ratio of the probability density function of y to the probability density function of x, or $$f'(x) = \frac{dy}{dx} = \frac{p(x)}{p(y)} \tag{4}$$

for y evaluated at x.

Similarly, the first derivative of the function g(y) is equal to the ratio of the probability of x to the probability of y, or $$g'(y) = \frac{dx}{dy} = \frac{p(y)}{p(x)} \tag{5}$$

for x evaluated at y.

From Equations 1 and 4, it follows that the function f(x) is equal to the integral of the ratio of the probability density functions for y and x, or $$y = f(x) = \int f'(x) \, dx = \int \frac{p(x)}{p(y)} \, dx \tag{6}$$

for y evaluated at x over the range of x and $$x = g(y) = \int g'(y) \, dy = \int \frac{p(y)}{p(x)} \, dy \qquad (7)$$

for x evaluated at y over the range of y.

Equations 6 and 7 may be analyzed numerically by a simple digital processor using discrete techniques provided that in the case of Equation 6 p(y) is uniformly distributed over the range of y, and in the case of Equation 7 p(x) is uniformly distributed over the range of x. For example, Equation 6 can be represented as follows:

$$y_n = f(x_n) = \sum_{n=0}^{N} \frac{p(x_n)}{p(y_n)} = Y \sum_{n=0}^{N} p(x_n) \qquad (8)$$

where Y is the range of y. And similarly:

$$x_n = g(y_n) = \sum_{n=0}^{N} \frac{p(y_n)}{p(x_n)} = X \sum_{n=0}^{N} p(y_n) \qquad (9)$$

where X is the range of x.

Referring to FIG. 2, there is shown one embodiment of a device according to the invention for analyzing a device which processes input signals x according to a function f. Specifically, FIG. 2 illustrates an apparatus for calibrating an analog-to-digital converter 12. The apparatus comprises an exciter 14 having an output 16 adapted to be coupled to the analog input 18 of the analog-to-digital converter 12, digital one out of N selector 20 having digital select inputs 22 from digital outputs 24 of the analog-to-digital converter 12 selecting one of a plurality of counters, for example, counters a through h 26-33, each counter 26-33 having a count input coupled to one output of a digital value detector and operative to tally the number of occurrences of a digital value assigned to the counter. The exciter 14, analog-to-digital converter 12 and digital value detectors 20 are operative under the synchronization of a timer/controller 34. The timer/controller 34 simply starts and stops the exciter 14 through a signal line 36, causes the analog-to-digital converter 12 to sample upon the occurrence of a signal on a sample control line 38, and causes the selector 20 to select the counter 26-33 corresponding to the ADC output. A unit value applied as a signal on control line 40 is then applied as an incremental count to the selected counter 26-33.

Exciter 14 is typically operative to generate repeatedly an excitation signal of accurately known duration and characteristic. For example, the exciter 14 might generate a ramp signal or an exponential signal having a duration of exactly T seconds. The counters 26-33 are operative to accumulate counts during each repeated excitation cycle. At the conclusion of a sequence of excitation cycles, the contents of the counters 26-33 form a histogram of the output y of the ADC 12. The unweighted histogram is by the Law of Large Numbers proportional to the amplitude probability density function of y, i.e., p(y). The function p(y), or the "measured" amplitude probability density function of y, may thereafter be used in connection with an analytically determined probability density function of x, p(x) to compute the transfer characteristic of y into x or g(y) which may be compared directly with the known excitation function x to determine bias errors in the ADC 12. The computation of the function g(y) is given by Equations 7 or 9, above. The transfer characteristic g(y) can further be mapped by known techniques into the transfer function f(x) to obtain the desired transfer characteristic of the ADC 12. The key to the relationship is given by Equations 4 and 5:

$$\frac{dx}{dy} = g'(y) = \frac{1}{f'(x)} \qquad (9a)$$

Histograms may be generated in a variety of ways, some of which are particularly adapted to application of a digital data processor. Referring to FIG. 3, there is shown a further specific device according to the invention in which elements of a digital processor are employed to generate a plurality of histograms which may be employed for calibrating an analog-to-digital converter 12. The tester comprises an exciter 14, a random access memory 42, a presettable counter 44, and a digital adder 46. The random access memory 42 includes an address decoder 48, means defining memory storage space 50, and the normal internal controls for responding to a Load signal, a Read signal and a Write signal, including data input and data output terminals 52 and 54. The presettable counter 44 is coupled between the data output terminals 54 and the data input terminals 52 and includes control lines responsive to a Load signal for presetting the counter with the data through terminals 54 and an Increment signal for incrementing the preset number in the counter 44. A controller 34 is provided to synchronize operation of the exciter 14, the converter under test 12, the RAM 42, the presettable counter 44, and the digital adder 46. The timer/controller 34 includes a master clock 56 coupled to an exciter controller 58 and a histogram controller 60. The exciter controller 58 controls the mode of operation of the exciter 14 and synchronizes the exciter 14 with the analog-to-digital converter 12. In particular, the exciter controller 58 provides a Start Converter cycle clock signal 62 (FIG. 4) through a signal line 64 to the analog-to-digital converter 12 at the commencement of each sample period. The analog-to-digital converter 12 generates an End of Conversion (EOC) signal 66 which is conveyed to the histogram controller 60 through an EOC line 68. The histogram controller 60 provides a number of timed output signal lines to the RAM 42 and counter 44, including a Load Address signal line 70, a Read Data Out signal line 72, a Write Data In signal line 74, a Load Counter signal line 76, and an Increment Counter signal line 78.

The apparatus works as follows in response to any excitation signal. Referring to FIGS. 3 and 4 at each sampling of the analog-to-digital converter 12, the controller 58 issues a Start Converter Clock signal 62 to the analog-to-digital converter 12. At the conclusion of the cycle, an End Of Conversion signal 66 from the converter 12 is conveyed via signal line 68 to the histogram controller 60 whereupon a Load Address signal 69 and a Read Data Out signal 71 cause the RAM 42 to decode the address from the analog-to-digital converter 12 and to present the contents of that address at the RAM output 54. After an appropriate settling time, a Load Counter signal 75 is issued via line 76 which loads the presettable counter 44 with the data at the RAM output 54. Thereafter, an Increment Counter signal 77 is issued on line 78 which increments the preset count in counter 44, whereupon a Write Data In signal 73 is issued on line 74 by the histogram controller 60 which causes the contents of the presettable counter 44 to be written into the decoded address in the RAM 42. This cycle continues with each sample of the ADC 12.

The exciter 14 according to one specific embodiment of the invention is capable of generating more than one type of excitation signal. Consequently, it is necessary to provide a mechanism for analyzing a plurality of input signals. To this end, adder 46 is included in the output path of the analog-to-digital converter 12. The adder 46 is coupled at one input terminal to an address bus 80 under the control of the exciter controller 58. The address bus 80 is operative to generate an Address Offset signal 82 or 82' (FIG. 4) for the duration of a particular excitation function. The value of Address Offset signal 82 or 82' is added to the digital value received from the analog-to-digital converter 12 in the adder 46 to preset a base address for storage of the histogram data in the RAM 42.

The exciter 14 according to the invention is preferably a signal generating device capable of generating a decaying exponential signal $x_1$ which decays from an accurately known initial value E toward a zero value in a period T, and a rising exponential $x_2$ which rises from an initial value zero toward a final value E in a period T. A suitable circuit comprises an RC network controlled by two switches 84 and 86 driving an amplifier 88 (FIG. 3). The RC network is coupled across voltage source 90 of an acccurately known potential E. (Those versed in the art will recognize that a constant current source is a functional equivalent of a voltage potential.) The exciter 14 is capable of generating simple, natural exponential functions, the accuracy of which is essentially invariably known, assuming the component values do not change in the course of operation. The amplitude density functions for the exciter signals are also known analytically. For example, the decaying exponential signal $x_1$ is given by the expression:

$$x_1 = Ee^{-t/RC} \quad (10)$$

where
R is the value of the resistor R1; and
C is the value of the capacitor C1.
The amplitude probability density function $p(x_1)$ is given by the expression:

$$p_1(x) = \frac{RC}{Tx_1} \quad (11)$$

for
$$Ee^{-T/RC} \leq x_1 \leq E$$
This expression holds true for all times between O and T.

Similarly, the amplitude probability density function for the rising exponential:

$$x_2 = E(1 - e^{-t/RC}) \quad (12)$$

is given by the expression:

$$p_2(x) = \frac{RC}{T(E - x_2)} \quad (13)$$

for
$$0 < x_2 < E(1 - e^{-T/RC})$$

The ascending and descending exponential functions have a curious characteristic which can be exploited according to the present invention. It can be shown, by mathematical manipulation and by recognizing that x is equal to a function of y from Equation 2, that the probability density function of a descending exponential over the range of y is equal to a constant times the ratio of the first derivative of the function in y to the function in y, or:

$$p_1(y) = \frac{RC}{T} \cdot \frac{g'(y)}{g(y)} \quad (14)$$

Similarly, the expression for the probability density function for an ascending exponential signal in y is given by the expression:

$$p_2(y) = \frac{RC}{T} \cdot \frac{g'(y)}{E - g(y)} \quad (15)$$

By the proper formation of a ratio of the probability density functions $p_1$ and $p_2$ in y, the function $g(y)$ may be obtained which is independent of the dynamic characteristics of the excitation function, that is, independent of the value of the resistor R, the capacitor C, and the duration T. The relationship holds true so long as the quantities R, C and T are stable for the duration of the test. Only the reference voltage E need be known absolutely. Specifically, combining Equations 14 and 15 yields the following expression for $g(y)$:

$$g(y) = \frac{p_2(y)}{p_1(y) + p_2(y)} \cdot E \quad (16)$$

If the value of the reference voltage, E, is unknown, the quantity:

$$\frac{g(y)}{E} = \frac{p_2(y)}{p_1(y) + p_2(y)}$$

will yield a relative (not absolute) calibration of the converter.

The historgrams of each excitation signal are constructed in the random access memory 42 (FIG. 3) in accordance with the operation of the present invention. Specifically, one portion of the memory space 50 is set aside for the histogram of $p_1(y)$ and $p_2(y)$. The histogram information may be directly utilized, or it may be processed further to extract the expression $g(y)$ in a processor 100. Once the expression $g(y)$ is obtained, it can be mapped into the forward transfer characteristic $f(x)$ in accordance with the relation of Equation 1. Any of the computed quantities may be used to characterize the converter transfer characteristic.

The present invention has shown how to manipulate the excitation signals to characterize an analog-to-digital converter by employing histogram analysis, and the invention has now been explained with respect to specific embodiments. Other embodiments will be apparent to those of ordinary skill in the art. It is therefore not intended that this invention be limited except as indicated by the appended claims.

What is claimed is:

1. A method for obtaining a transfer characteristic of an analog-to-digital converter under test, said analog-to-digital converter having an analog input and a digital output, said method comprising the steps of:
   exciting said analog-to-digital converter input with a first analog signal of a first known function, said first known function having a first amplitude probability density function;

detecting digital output signals at said analog-to-digital converter output as values unique to selected combinations of output bits;

counting the number of occurrences of each selected output bit combination in response to said first analog signal thereby to produce a first measured histogram, said histogram being proportional to a second amplitude probability density function characterizing said transfer characteristic of said analog-to-digital converter under test; and integrating the ratio of said second amplitude probability density function from said first measured histogram to said first amplitude probability density function of said first analog signal over the range of values for said transfer characteristic in order to obtain said transfer characteristic.

2. The method according to claim 1 further including the step of exciting said analog-to-digital converter with a second analog signal of a second known function and third amplitude probability density function;

distinguishing between digital output signals provided in response to said first analog signal and said second analog signal;

counting the number of occurrences of selected output bit combinations in response to said second analog signal thereby to produce a second measured histogram corresponding to a fourth amplitude probability density function; and processing said fourth amplitude probability density function and said second amplitude probability density function by dividing the value of the fourth amplitude probability density function by the sum of the values of the second amplitude probability density function and the fourth amplitude probability density function to produce a transfer characteristic of said analog-to-digital converter.

3. The method according to claim 2 wherein said first analog signal is a decaying exponential function signal and said second analog signal is an increasing exponential function signal which is an exact complement of said first analog signal and wherein said processing step comprises dividing the value of said second histogram by the sum of the values of said first histogram and said second histogram to obtain a value proportional to a transfer characteristic for said analog-to-digital converter under test.

4. The method according to claim 1 wherein said detecting step comprises decoding said digital output signal as an address of a random access memory, and said counting step comprises incrementing a current value in an address location of a digital memory each time said address location is decoded.

5. An apparatus for obtaining a transfer characteristic of an analog-to-digital converter under test, said analog-to-digital converter having an analog input and a digital output, said apparatus comprising:

means adapted to be coupled to said analog input for exciting said analog-to-digital converter with a first analog signal, said first analog signal being of a known first function and first amplitude probability density function;

means adapted to be coupled to said digital output of said analog-to-digital converter for detecting digital output signals of said analog-to-digital converter as values unique to selected combinations of output bits;

means coupled to said detecting means for counting occurrences of selected output bit combinations in response to said first analog signal thereby to produce a first measured histogram, said first histogram being proportional to a second amplitude probability density function, said second amplitude probability density function for characterizing a transfer characteristic for said analog-to-digital converter under test;

means coupled to said counting means being adapted to receive a signal representative of said first measured histogram and responsive to signals representative of said first known function and amplitude probability density function of said analog signal for producing a signal representative of a transfer characteristic of said analog-to-digital converter corresponding to said first measured histogram; and means for integrating the ratio of said second amplitude probability density function to said first amplitude probability density function over the range of values and said transfer characteristic to obtain said transfer characteristic.

6. The apparatus according to claim 5 wherein said exciting means is an exponential function generator including means for initiating and terminating said first analog signal, wherein said detecting means is an address decoder of a random access memory which is adapted to be coupled to said digital output of said analog-to-digital converter, and wherein said counting means is a presettable counter which is operative to read a digital value in a memory location, to increment said digital value, and to write a resultant value into said memory location.

7. The apparatus according to claim 6 wherein said exciting means is further operative to excite said converter with a second analog signal a second known function and third amplitude probability density function, and further including means for distinguishing output signals generated in response to said first analog signal from output signals generated in response to said second analog signal, and wherein said counting means is further responsive to said distinguishing means for counting occurrences of selected output bit combinations produced by said second analog signal, thereby to produce a second measured histogram corresponding to a fourth amplitude probability density function.

8. The apparatus according to claim 7 further including means coupled to said counting means adapted to receive a signal representative of said first measured histogram and a signal representative of said second measured histogram for processing said first and second measured histograms by dividing the value of said second histogram by the sum of the values of said first histogram and said second histogram to produce a transfer characteristic of said analog-to-digital converter, said transfer characteristic being independent of time and transient characteristics of said first analog signal and said second analog signal.

9. The apparatus according to claim 8 wherein said exciting means is operative to generate a decaying exponential signal as said first analog signal and an increasing exponential signal as said second analog signal, said first analog signal being the exact complement of said second analog signal.

10. The apparatus according to claim 9 wherein said processing means comprises a signal processor operative according to the following relation:

$$g(y) = \frac{p_2(y)}{p_1(y) + p_2(y)} \cdot E$$

where
E is the known initial value of said first analog signal and said second analog signal;
$p_1(y)$ is the amplitude probability density function corresponding to said first measured histogram; and
$p_2(y)$ is the amplitude probability density function corresponding to said second measured histogram.

11. The apparatus according to claim 5 wherein said exciting means is an exponential function generator including means for initiating and terminating said first and second analog signals, wherein said detecting means is an address decoder of a random access memory adapted to be coupled to said digital output of said analog-to-digital converter, and wherein said counting means is a presettable counter operative to read a digital value in a memory location, to increment said digital value, and to write a resultant value into said memory location.

12. The apparatus according to claim 5 wherein said exciting means is an exponential function generator including means for initiating and terminating said first and second analog signals, wherein said detecting means is a one of N selector, and wherein said counting means is a plurality of counters, each counter being coupled to a decoder and each counter being operative to count and accumulate each occurrence of a signal decoded by an associated decoder.

* * * * *